(12) United States Patent
Miyajima et al.

(10) Patent No.: US 7,463,335 B2
(45) Date of Patent: *Dec. 9, 2008

(54) EXPOSURE APPARATUS, AND DEVICE MANUFACTURING METHOD

(75) Inventors: Yoshikazu Miyajima, Utsunomiya (JP); Takashi Meguro, Utsunomiya (JP)

(73) Assignee: Canon Kabuhsiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/762,286

(22) Filed: Jun. 13, 2007

(65) Prior Publication Data

US 2007/0285648 A1    Dec. 13, 2007

Related U.S. Application Data

(62) Division of application No. 11/251,837, filed on Oct. 18, 2005, now Pat. No. 7,253,877.

(30) Foreign Application Priority Data

Oct. 20, 2004    (JP) .............................. 2004-306054

(51) Int. Cl.
*G03B 27/72* (2006.01)
*G03B 27/42* (2006.01)

(52) U.S. Cl. .......................................... 355/71; 355/53

(58) Field of Classification Search .................. 355/53, 355/67, 71
See application file for complete search history.

(56) References Cited

U.S. PATENT DOCUMENTS

| 6,040,893 | A | 3/2000 | Ebinuma | 355/53 |
| 6,262,794 | B1 | 7/2001 | Miyajima | 355/53 |
| 6,408,045 | B1 | 6/2002 | Matsui et al. | 378/34 |
| 6,538,720 | B2 | 3/2003 | Galburt et al. | 355/53 |
| 6,784,978 | B2 | 8/2004 | Galburt | 355/72 |
| 6,999,162 | B1 * | 2/2006 | Takahashi | 355/75 |
| 7,253,877 | B2 * | 8/2007 | Miyajima et al. | 355/53 |
| 2005/0093666 | A1 | 5/2005 | Miyajima et al. | 355/285 |
| 2005/0185166 | A1 | 8/2005 | Miyajima et al. | 355/75 |

FOREIGN PATENT DOCUMENTS

JP    10-97989    4/1998

* cited by examiner

*Primary Examiner*—Alan A Mathews
(74) *Attorney, Agent, or Firm*—Fitzpatrick, Cella, Harper & Scinto

(57) ABSTRACT

An exposure apparatus for illuminating an original through an illumination system and for transferring a pattern of the original onto a substrate. The apparatus includes a movable element having a blade, the blade being provided in the illumination system and blocking at least a portion of illumination light, a stator configured to relatively move the movable element, and a resilient supporting member configured to resiliently support the stator without contacting the stator.

7 Claims, 6 Drawing Sheets

EXPOSURE APPARATUS, AND DEVICE MANUFACTURING METHOD

This application is a divisional application of U.S. patent application Ser. No. 11/251,837, filed Oct. 18, 2005 now U.S. Pat. No. 7,253,877.

FIELD OF THE INVENTION AND RELATED ART

This invention relates to an exposure apparatus and an exposure method usable in the manufacture of semiconductor devices, for example, for transferring a pattern onto a resist upon a substrate by exposure. In another aspect, the invention concerns a device manufacturing method that uses such an exposure apparatus or an exposure method.

A scanning exposure method (step-and-scan method) is now the main stream of exposure apparatuses, in which illumination light of a slit-like shape having a size approximately corresponding to the diameter of a circular imaging region of a projection optical system is used, and in which a reticle and a wafer are synchronously and scanningly moved thereby to enlarge the transfer region.

According to this method, as compared with a step-and-repeat method in which simultaneous exposure is carried out with respect to each transfer region by using a projection lens, if a projection optical system having an imaging region of the same size is used, a larger transfer region can be provided.

Japanese Laid-Open Patent Application, Publication No. 10-097989, shows this type of an exposure apparatus having blade means, which is provided as light blocking means to prevent irradiation of unnecessary shot regions with light, the blade means being moved in synchronism with the scan motion of a reticle and a wafer.

However, if the blade means is moved, a drive reaction force produced by moving the blade may be transmitted through a blade support to an illumination support system as an external disturbance. If it occurs, vibration may remain in the main frame of the exposure apparatus, which will, in turn, put vibratory external disturbance on the projection lens and/or the reticle stage. The precision of exposure may be degraded thereby.

SUMMARY OF THE INVENTION

It is accordingly an object of the present invention to provide an improved exposure apparatus and/or an improved exposure method by which the inconvenience described above can be removed or reduced.

In accordance with an aspect of the present invention, there is provided an exposure apparatus for projecting, by exposure, a pattern of an original onto a substrate, the apparatus comprising light blocking means for blocking at least a portion of exposure light, driving means for moving the light blocking means, and reaction force absorbing means for absorbing a drive reaction force of the driving means, wherein the driving means includes a stator, and wherein the reaction force absorbing means absorbs the reaction force by moving the stator of the driving means.

With this structure of the present invention, adverse influence of vibratory external disturbance, to be caused by a drive reaction force as the blade of the light blocking system is driven, can be reduced significantly.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings. Specifically, the invention will be described with reference to an example of a scan type exposure apparatus wherein an original is a reticle and a substrate is a wafer. FIGS. 1-6 show a few embodiments of the present invention.

Embodiment 1

Figure 1:
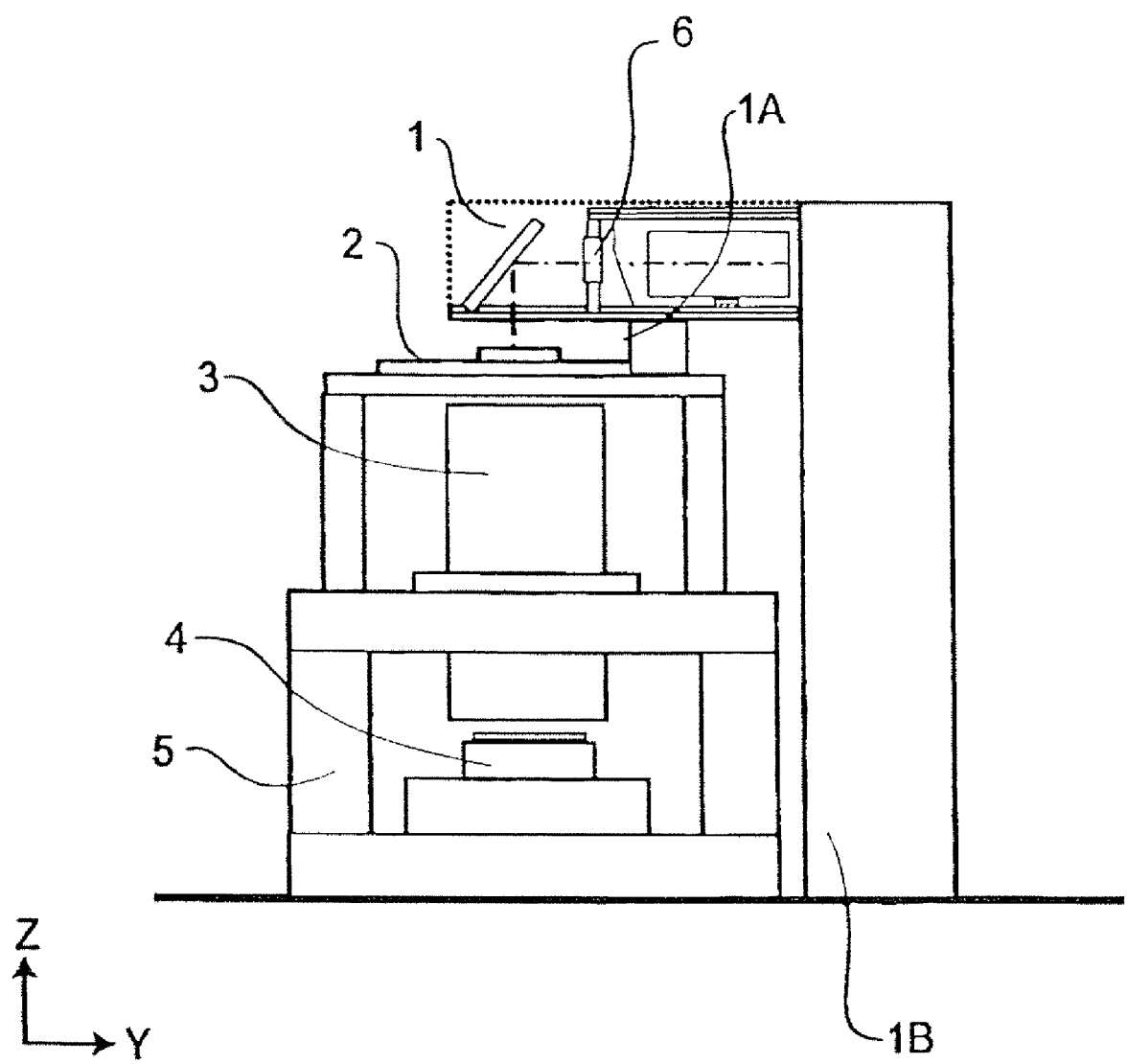
FIG. 1 is a schematic and elevational view of a main portion of an exposure apparatus including an illumination system, according to an embodiment of the present invention.
Figure 2:
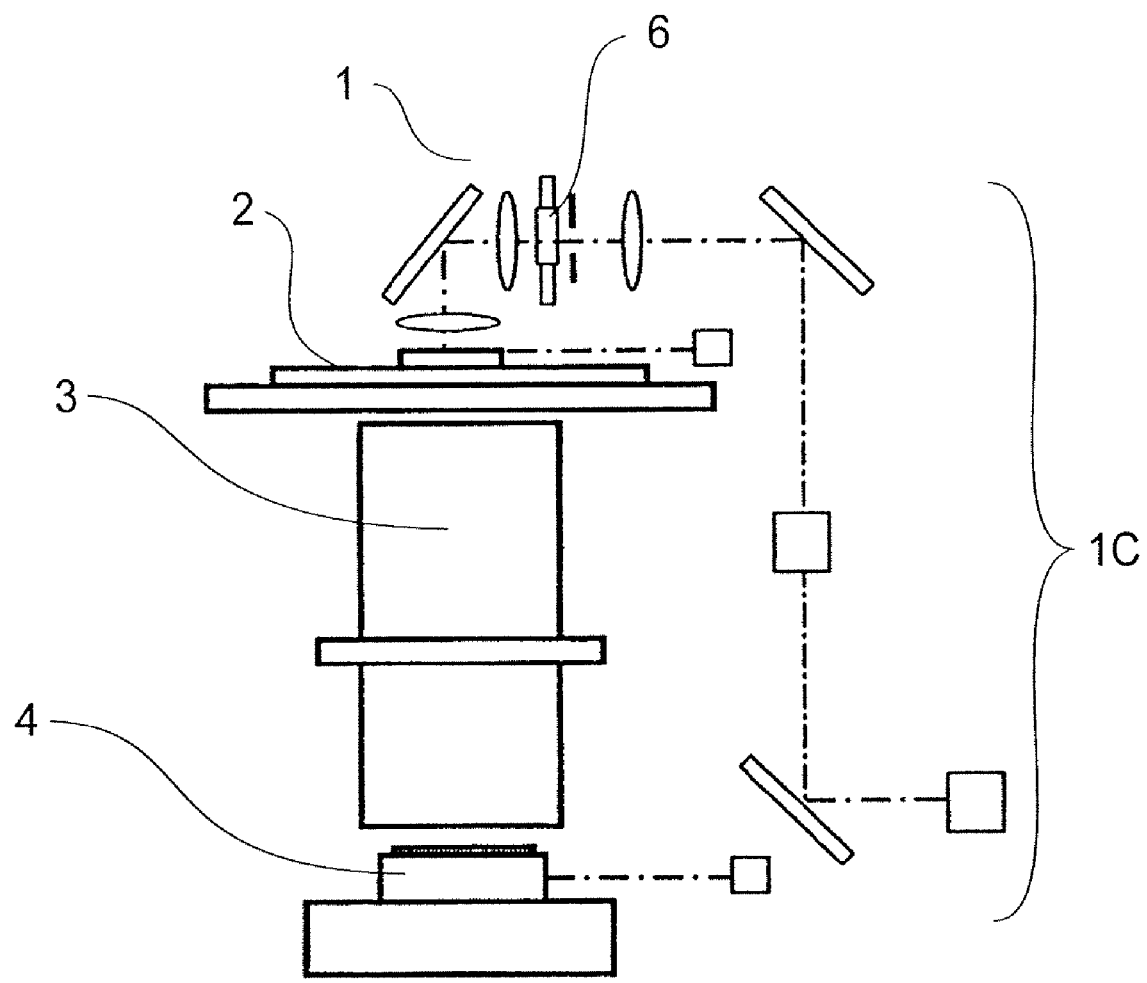
FIG. 2 is a schematic view for explaining disposition of an illumination system and other components, according to an embodiment of the present invention.

FIG. 1 is a schematic and elevational view of a main portion of an exposure apparatus including an illumination system, according to an embodiment of the present invention. FIG. 2 illustrates the disposition of an illumination system, and the like, of the first embodiment.

Denoted in these drawings at 1 is an illumination system, which is a function for projecting an exposure light source and exposure light toward a reticle while shaping the light. Denoted at 1A is an illumination system support base that functions to fixedly support the illumination system unit 1 with respect to a main frame 5 of the exposure apparatus. Denoted at 1B is an illumination system light source introducing unit. Denoted in FIG. 2 at 1C is an illumination system that includes the illumination system light source introducing unit 1B.

Denoted at 2 is a reticle stage that carries thereon a reticle, which is an original of an exposure pattern. The reticle stage 2 is scanningly moved relative to a wafer at the ratio of reduction exposure magnification with respect to the wafer. Denoted at 3 is a projection lens for projecting the original pattern onto the wafer (substrate) in a reduced scale.

Denoted at 4 is a wafer stage. For individual exposures, the wafer stage functions to sequentially and successively move and position the substrate (wafer) with respect to the exposure position defined in relation to the reduction projection lens 3. Denoted at 5 is the main frame of the exposure apparatus, and it supports the reticle stage 2, the reduction projection lens 3, the wafer stage 4, and so on.

Denoted at 6 is a scan masking unit, which includes light blocking means for blocking light to the pattern of the reticle. The light blocking means comprises at least one plate-like member (hereinafter, a "blade"), which is disposed upon a plane being conjugate with the reticle surface.

In scanning exposure apparatuses, since the reticle and the wafer are scanningly moved, the blade member, such as described above, has to be moved as well, in synchronism with the reticle and wafer motion.

Figure 3:
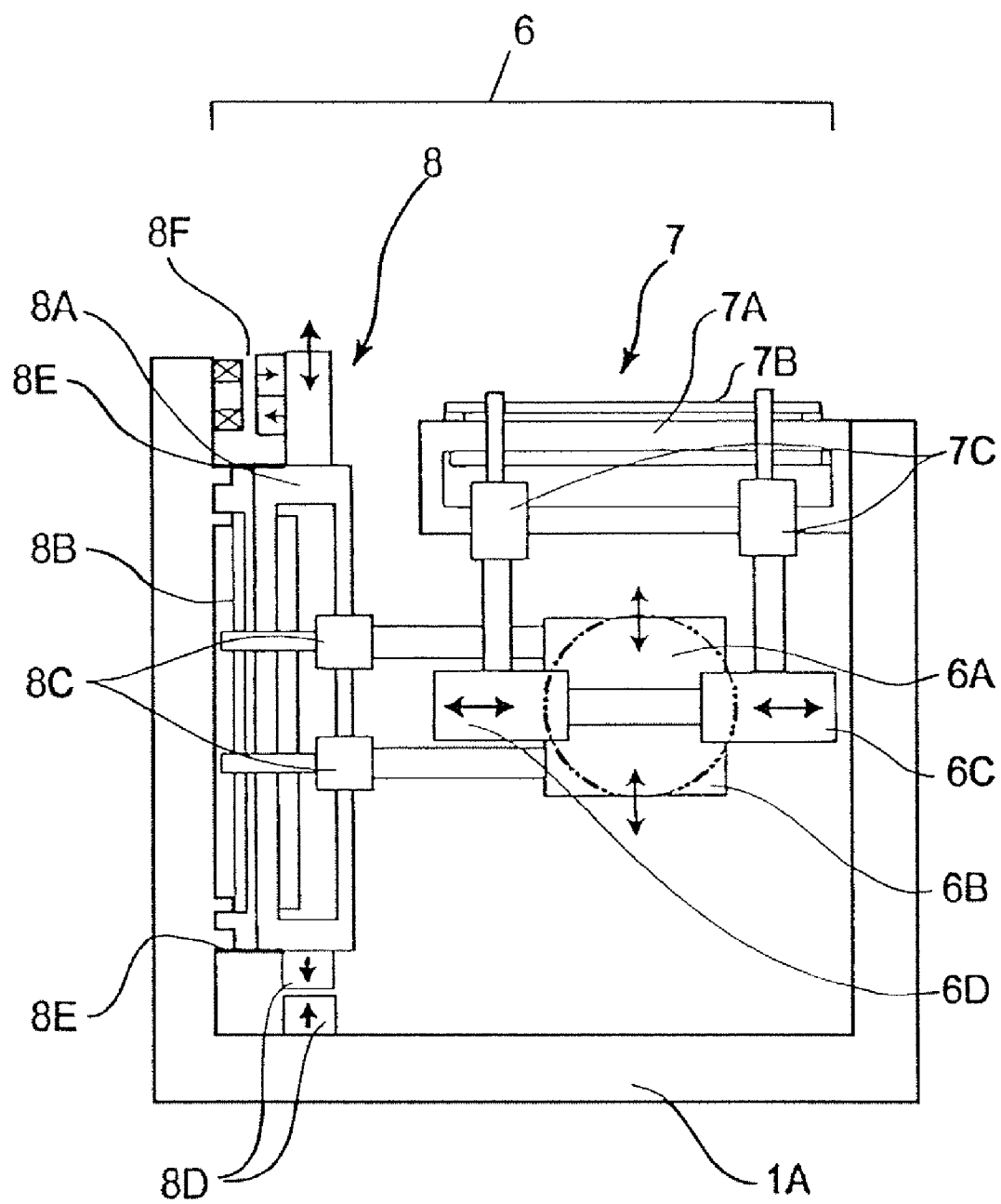
FIG. 3 is a plan view of a scan masking blade unit according to an embodiment of the present invention.

Referring to FIG. 3, the scan masking unit according to this embodiment of the present invention will be explained in greater detail. The scan masking unit 6 includes an X scan masking unit 7 and a Y scan masking unit 8. Denoted at 6A and 6B are Y blades, and these Y blades 6A and 6B are scanningly moved as well for scanning motion of the reticle, approximately in synchronism with the reticle scan motion. Denoted at 6C and 6D are X blades, and these X blades are moved in a direction orthogonal to the scanning movement direction of the Y blades 6A and 6B to thereby perform light blocking in the scan widthwise direction of the reticle.

Denoted at 7 is the X scan masking unit. Denoted at 7A is a stator for an X linear motor that functions to move the X blades 6C and 6D in the X direction by use of X movable elements 7C. Denoted at 7B is an X linear encoder, which is provided to measure the position of the X blades 6C and 6D.

Denoted at 8A is a stator for a Y linear motor that functions to move the Y blades 6A and 6B in the Y direction by use of Y movable elements 8C. Denoted at 8B is a Y linear encoder, which is provided to measure the position of the Y blades 6A and 6B.

There are self-weight compensating magnets 8D as magnet means for compensating for the self weight of the Y linear motor. These magnets are provided with the same magnetic poles disposed opposed to each other, to enable the weight compensation without contact to each other. Denoted at 8E are leaf springs that serve to provide resilient support between the illumination system base 1A and the Y linear motor stator 8A. Each leaf spring 8E has one end fixed to the illumination system support base 1A, so that they can resiliently support the Y linear motor stator 8A movably in the thrust producing direction of the Y linear motor.

Denoted at 8F is a stator position controlling motor, and it functions to control the movement position of the stator 8A of the Y linear motor in the thrust direction thereof.

Within the structure described above, the Y blades 6A and 6B are scanningly moved, and a drive reaction force of the Y movable elements 8C may be produced with respect to the Y linear motor stator 8A. If this occurs, the stator 8A of the Y linear motor moves in a direction of an arrow in the drawing, and it can function as a passive counter to absorb the drive reaction force.

Furthermore, the Y linear motor stator 8A shifted as described above is stabilized and returning-position controlled by means of the stator position controlling motor 8F. By this, the position of the Y linear motor stator 8A can be stabilized and maintained at an approximately neutral position.

As a consequence of the above, no vibratory external disturbance is applied to the illumination system support base 1A and, thus, there is no possibility of vibration remaining in the main frame 5 of the exposure apparatus. Therefore, transmission of vibratory external disturbance to the reduction projection lens 3 and the reticle stage 2 can be avoided, and degradation of exposure precision can be prevented.

Although the above-described structure is particularly effective in relation to a linear motor that drives a blade in the scan direction (Y direction), it still has an effect with respect to the X direction. This will be explained with reference to a second embodiment of the present invention.

Embodiment 2

Figure 4:
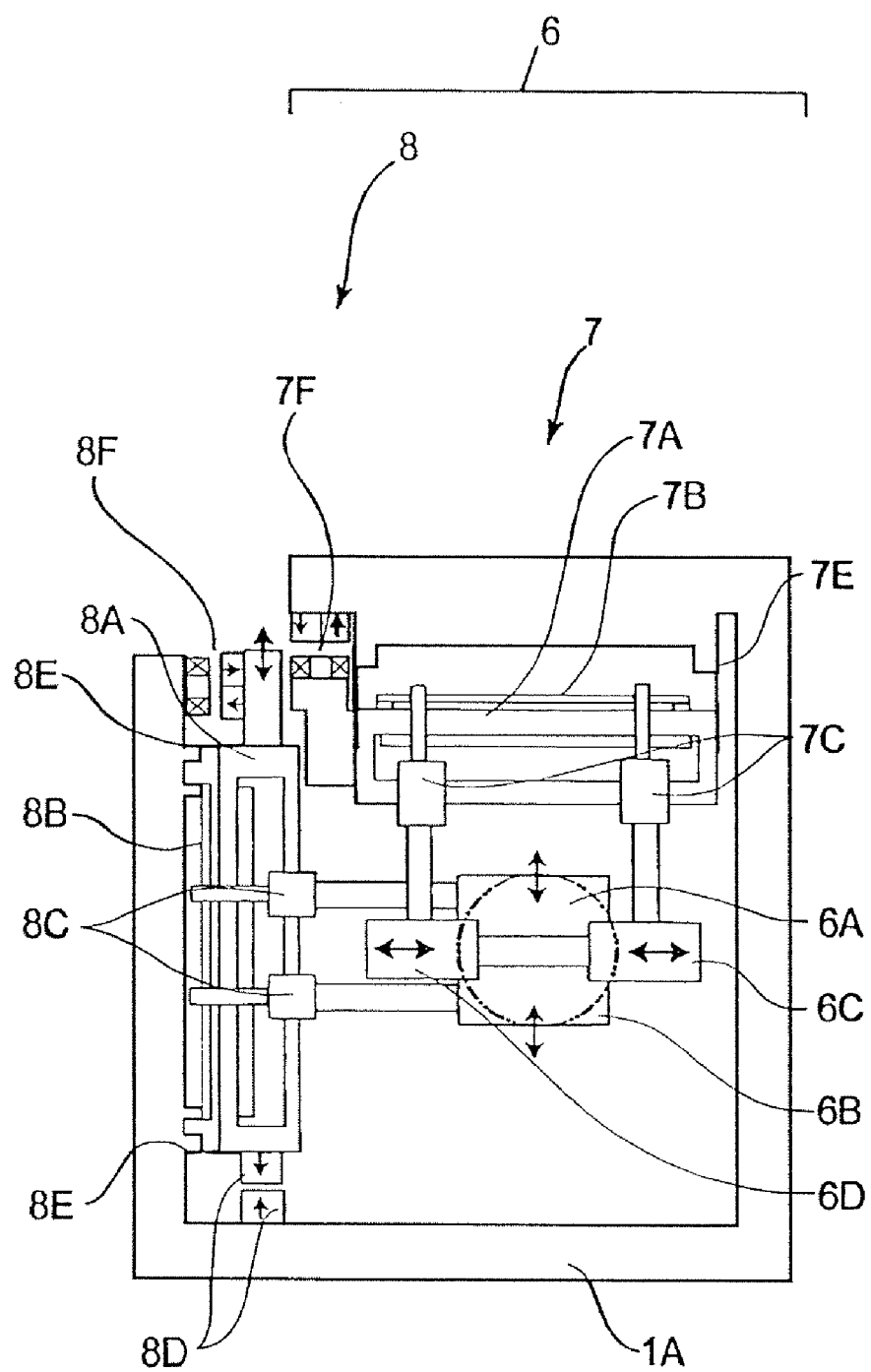
FIG. 4 is a plan view of a scan masking blade unit according to another embodiment of the present invention.

FIG. 4 is a plan view of a scan masking blade unit in a second embodiment of the present invention. In the first embodiment described above, the absorbing means for absorbing the reaction force of the Y blades 6A and 6B comprises the leaf springs 8E and the stator position controlling motor 8F. In addition to these components, in the second embodiment of the present invention, as shown in FIG. 4, there are leaf springs 7E at positions corresponding to the opposite ends of the X linear motor stator 7A and, also, there is a stator position controlling motor 7F at one end side of the X linear motor stator 7A.

Each leaf spring 7E has an end fixed to the illumination system support base 1A, so that they resiliently support the X linear motor stator 7A movably in the thrust producing direction of the X linear motor. The stator position controlling motor 7F functions to control the movement position of the stator 7A of the X linear motor, with respect to the thrust direction thereof.

In accordance with this embodiment of the present invention as described above, as regards the Y blades 6C and 6D of the X liner motor stator 7A, as well, as with the Y blades 6A and 6B, they function to resiliently support the X linear motor stator 7A through the leaf springs 7E and with respect to the drive reaction force producing direction. Also, with the provision of the stator position controlling motor 7F, the drive reaction force of the X linear motor can be absorbed.

Embodiment 3

Next, referring to FIGS. 5 and 6, an embodiment of a device manufacturing method, which uses an exposure apparatus described above, will be explained as a third embodiment of the present invention.

Figure 5:
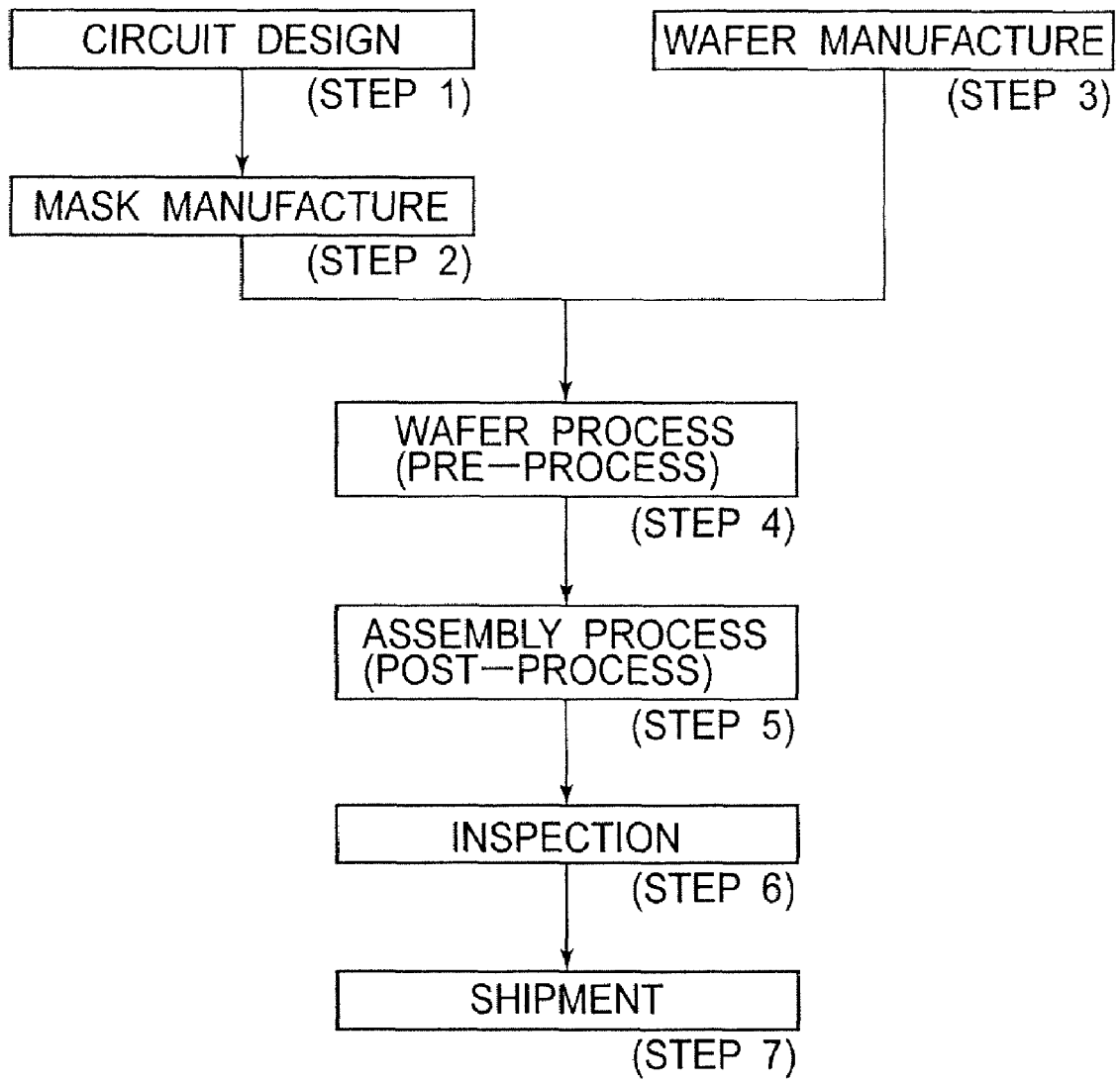
FIG. 5 is a flow chart for explaining the procedure of device manufacturing processes, in an embodiment of the present invention.

FIG. 5 is a flow chart for explaining a general procedure of manufacturing various microdevices, such as semiconductor chips, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a preprocess, wherein, by using the thus prepared mask and wafer, a circuit is formed on the wafer in practice, in accordance with lithography. Step 5, subsequent to this, is an assembling step, which is called a post-process, wherein the wafer, having been processing at step 4, is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 6:
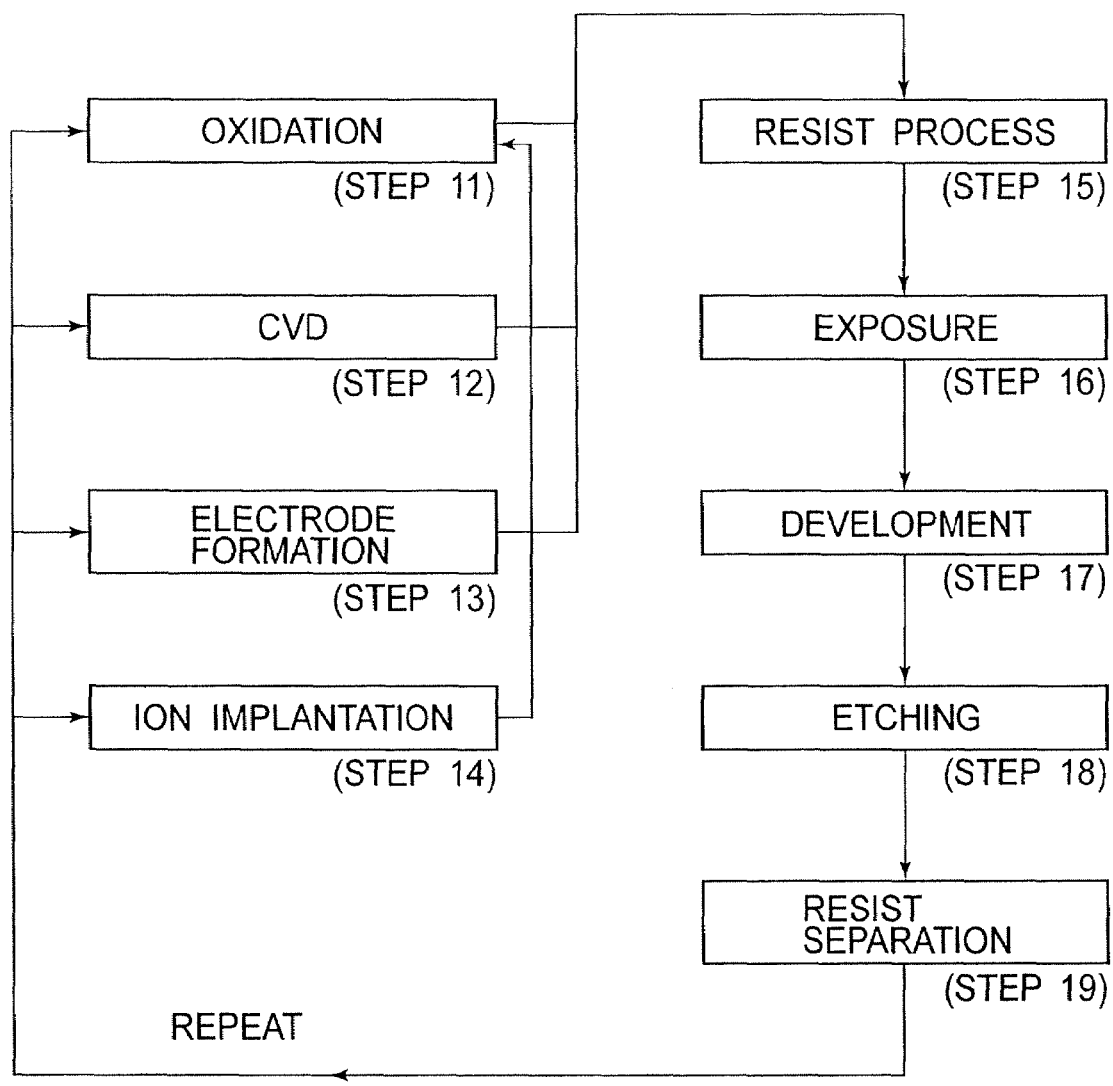
FIG. 6 is a flow chart for explaining details of a wafer process, in an embodiment of the present invention.

The wafer process at Step 4 may include the following steps, as shown in FIG. 6. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-306054, filed Oct. 20, 2004, which is hereby incorporated by reference.

The invention claimed is:

1. An exposure apparatus for illuminating an original through an illumination system and for transferring a pattern of the original onto a substrate, said apparatus comprising:
   a movable element having a blade, the blade being provided in the illumination system and blocking at least a portion of illumination light;
   a stator configured to relatively move said movable element; and
   a resilient supporting member configured to resiliently support said stator without contacting said stator.

2. An apparatus according to claim 1, wherein said resilient supporting member resiliently supports said stator so as to absorb a reaction force produced while said movable element moves relatively to said stator.

3. An apparatus according to claim 1, wherein said resilient supporting member includes a magnet.

4. An exposure apparatus for illuminating an original through an illumination system and for transferring a pattern of the original onto a substrate, said apparatus comprising:
   a movable element having a blade, the blade being provided in the illumination system and blocking at least a portion of illumination light;
   a stator configured to relatively move said movable element;
   a resilient supporting member configured to resiliently support said stator; and
   a motor configured to control a position of said stator being resiliently displaced.

5. An apparatus according to claim 4, wherein said resilient supporting member resiliently supports said stator so as to absorb a reaction force produced while said movable element moves relative to said stator.

6. An apparatus according to claim 4, wherein said motor controls the position of said stator with respect to a direction parallel to a movement direction of said movable element.

7. An apparatus according to claim 4, wherein said motor includes a linear motor.

* * * * *